United States Patent
Lee

(10) Patent No.: US 9,568,155 B2
(45) Date of Patent: Feb. 14, 2017

(54) LIGHT CONVERSION MEMBER AND LIGHTING DEVICE INCLUDING THE SAME

(71) Applicant: LG INNOTEK CO., LTD., Seoul (KR)

(72) Inventor: Chang Hyuck Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 13 days.

(21) Appl. No.: 14/561,734

(22) Filed: Dec. 5, 2014

(65) Prior Publication Data
US 2015/0159820 A1   Jun. 11, 2015

(30) Foreign Application Priority Data

Dec. 5, 2013 (KR) .................. 10-2013-0150487

(51) Int. Cl.
| | | |
|---|---|---|
| F21V 9/16 | (2006.01) | |
| F21V 13/08 | (2006.01) | |
| F21K 99/00 | (2016.01) | |
| H01L 33/50 | (2010.01) | |
| H01S 5/00 | (2006.01) | |
| F21V 7/06 | (2006.01) | |
| F21Y 101/00 | (2016.01) | |

(52) U.S. Cl.
CPC . *F21K 9/56* (2013.01); *F21K 9/64* (2016.08); *F21V 9/16* (2013.01); *F21V 13/08* (2013.01); *F21V 7/06* (2013.01); *F21Y 2101/00* (2013.01); *F21Y 2115/30* (2016.08); *H01L 33/507* (2013.01); *H01S 5/005* (2013.01)

(58) Field of Classification Search
CPC .............. F21K 9/56; F21K 9/64; C09K 11/00; F21V 7/06; F21V 9/16; F21V 13/08; H01L 33/507; H01S 5/005; F21Y 2115/30
See application file for complete search history.

(56) References Cited

U.S. PATENT DOCUMENTS

| | | | | |
|---|---|---|---|---|
| 4,200,395 A | * | 4/1980 | Smith | G03F 9/7049 250/550 |
| 7,310,359 B2 | * | 12/2007 | Chou | H01S 3/042 372/33 |
| 8,506,103 B2 | * | 8/2013 | Iimura | F21K 9/135 362/254 |
| 8,610,341 B2 | * | 12/2013 | Dai | F21K 9/135 257/98 |

(Continued)

FOREIGN PATENT DOCUMENTS

| | | |
|---|---|---|
| EP | 2 595 204 A2 | 5/2013 |
| JP | 2009-200534 A | 9/2009 |

(Continued)

OTHER PUBLICATIONS

European Search Report dated Jul. 13, 2015 issued in Application No. 14196629.1.

(Continued)

*Primary Examiner* — Alan Cariaso
(74) *Attorney, Agent, or Firm* — KED & Associates, LLP

(57) ABSTRACT

A light conversion member includes a surface of incidence which includes a recessed portion and on which a laser beam is incident and an output surface in which a wavelength of the laser beam is converted and the laser beam having the converted wavelength is output. The recessed portion has a shape corresponding to a wave front shape of the laser beam.

11 Claims, 5 Drawing Sheets

(56) References Cited

U.S. PATENT DOCUMENTS

| | | | |
|---|---|---|---|
| 8,957,580 B2* | 2/2015 | Reiherzer | F21K 9/56 |
| | | | 313/498 |
| 8,969,903 B2* | 3/2015 | Yamanaka | H01L 33/58 |
| | | | 257/79 |
| 2006/0092644 A1 | 5/2006 | Mok et al. | |
| 2007/0085100 A1* | 4/2007 | Diana | B82Y 20/00 |
| | | | 257/98 |
| 2008/0310158 A1 | 12/2008 | Harbers et al. | |
| 2010/0084678 A1 | 4/2010 | Streubel et al. | |
| 2010/0181582 A1 | 7/2010 | Li et al. | |
| 2010/0295438 A1 | 11/2010 | Ott et al. | |
| 2012/0206786 A1* | 8/2012 | Ito | G02B 19/0014 |
| | | | 359/238 |
| 2015/0078031 A1* | 3/2015 | Komazaki | A61B 1/0653 |
| | | | 362/583 |
| 2015/0338044 A1* | 11/2015 | Singer | F21V 7/22 |
| | | | 362/510 |

FOREIGN PATENT DOCUMENTS

| | | |
|---|---|---|
| JP | 2009-206228 A | 9/2009 |
| JP | 2009-231368 A | 10/2009 |
| JP | 2012-068465 A | 4/2012 |
| WO | WO 2008/060335 A1 | 5/2008 |
| WO | WO 2012/157644 A1 | 11/2012 |

OTHER PUBLICATIONS

European Search Report dated Apr. 9, 2015 issued in Application No. 14196629.1.

* cited by examiner (a)          (b)

LIGHT CONVERSION MEMBER AND LIGHTING DEVICE INCLUDING THE SAME

CROSS-REFERENCE TO RELATED APPLICATION

This application claims priority under 35 U.S.C. §119 to Korean Application No. 10-2013-0150487 filed on Dec. 5, 2013, whose entire disclosure is incorporated herein by reference.

BACKGROUND

1. Field

The present application relates to a light conversion member and a lighting device including the same.

2. Background

A luminous element is a device which converts electricity into light. A light emitting diode (LED), a laser diode (LD), a laser and the like are representative luminous elements. As the demand for highly efficient low-power light sources has increased, active study on lasers, LDs and the high-power LEDs is in progress.

Generally, a highly efficient low-power light source emits excitation light having a wavelength of 500 nm or less, and the excitation light may be converted into visible light by a light conversion member such a phosphor and a quantum dot for use in a lighting device. However, some of the excitation light may be lost while incident on the light conversion member by Fresnel reflection of the surface of incidence.

BRIEF DESCRIPTION OF THE DRAWINGS

The embodiments will be described in detail with reference to the following drawings in which like reference numerals refer to like elements wherein.

DETAILED DESCRIPTION

Figure 1:
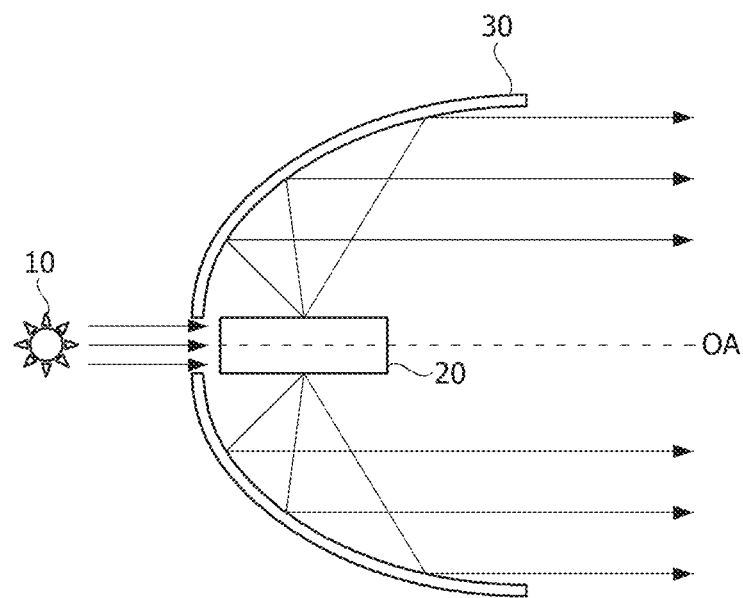
FIG. 1 is a view illustrating an example of a lighting device according to one embodiment of the present application.

FIG. 1 is a view illustrating an example of a lighting device according to one embodiment of the present application. The lighting device includes a light source 10, a light conversion member 20 which converts a wavelength of light incident from the light source 10 and then outputs the converted light, and a reflection member 30 which reflects the light output from the light conversion member 20.

The light source 10, which is a light emitting device which excites (optically pumps) a laser medium, emits a laser beam. The laser beam emitted from the light source 10 is excitation light which may have a wavelength of 500 nm or less, but is not limited thereto. The light source 10 may include a laser, a laser diode (LD) and so on.

The light conversion member 20 is arranged on a path (hereinafter referred to as an "optical path") of the light emitted from the light source 10, and performs wavelength conversion of the excitation light emitted from the light source 10. The light conversion member 20 may include a phosphor, a remote phosphor, a quantum dot, etc. An anti-reflection (AR) layer which enhances light incidence efficiency may be formed on a surface of incidence of the light conversion member 20 on which the excitation light emitted from the light source 10 is incident.

The reflection member 30 serves to reflect the light passing through the light conversion member 20 and to output the light as an output of the lighting device. The reflection member 30 has an inner surface formed as a curved surface having a parabolic shape, and may serve as a multifocal reflection member which reflects the light using a reflecting surface formed on the inner surface thereof.

In the lighting device having the structure shown in FIG. 1, the light conversion member 20 is formed in a cylindrical shape, and the light of which the wavelength is converted through the light conversion member 20 may be output in all directions through surfaces other than the surface of incidence. Therefore, to collect the light, which is output in all directions, in an output direction of the lighting device, the reflection member 30 may be formed in a shape which is rotationally symmetric about an optical axis (OA), such that the reflecting surface thereof surrounds an outer circumferential surface of the of the light conversion member 20. The OA is a virtual straight line which indicates a moving direction of the light at a center of a three-dimensional luminous flux from a point light source.

Figure 2:
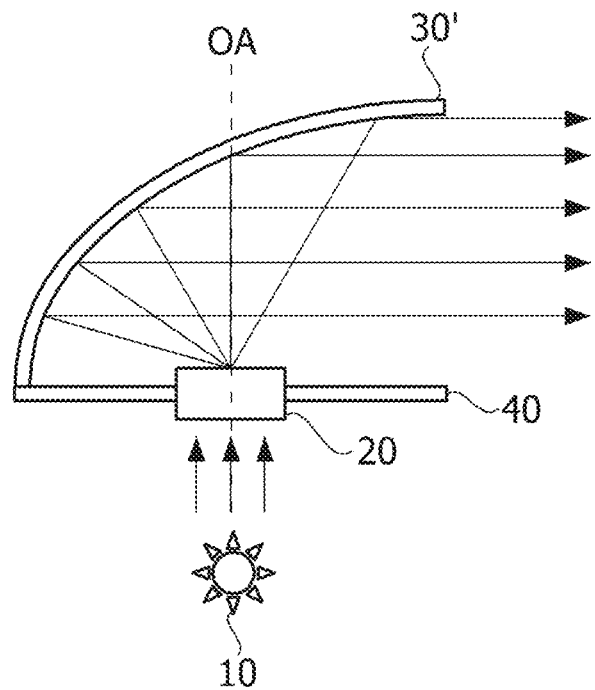
FIG. 2 is a view illustrating another example of the lighting device according to another embodiment of the present application.

FIG. 2 is a view illustrating another example of the lighting device according to another embodiment of the present application. Unlike the lighting device illustrated in FIG. 1, the light conversion member 20 is arranged above the light source 10. The light conversion member 20 may be disposed to pass through a fixing member 40.

A reflection member 30' is disposed on the fixing member 40, and has an inner surface formed as a curved surface having a parabolic shape or an elliptical shape. Further, the inner surface includes a reflecting surface which reflects light output from the light conversion member 20.

One surface of the light conversion member 20 may serve as a surface of incidence on which excitation light is incident from the light source 10, and the other surface thereof may serve as an output surface from which light having a converted wavelength is output. The reflection member 30' is provided above the light conversion member 20 so that the reflecting surface surrounds only the output surface of the light conversion member 20. Therefore, there is a disadvantage in that a light output area is reduced, compared with the reflection member 30 illustrated in FIG. 1.

As illustrated in FIGS. 1 and 2, in the lighting device in which a wavelength of light excited from the light source 10 is converted using the light conversion member 20 and the light having the converted wavelength is used, there may be a problem in that some of the light excited from the light source 10 may be lost while incident on the light conversion member 20 by Fresnel reflection at the surface of incidence.

According to a Fresnel equation which defines a relationship between a reflection coefficient and a transmission coefficient at a boundary surface with another medium having a different refractive index, a transmittance may be changed depending on an angle of incidence of the light at the boundary surface. According to the Fresnel equation, in the case of incident light which is perpendicular to the boundary surface, the transmittance is 100%, but in the case of other incident light which is not perpendicular to the boundary surface, the transmittance is reduced, and thus optical loss occurs.

In the case of a laser beam, the laser beam does not move straight when emitted from the light source 10, but moves at a certain divergence angle. Therefore, some of the light emitted from the light source 10 is incident on the surface of incidence of the light conversion member 20 at a non-perpendicular angle of incidence. As defined in the Fresnel equation, the light incident at the non-perpendicular angle of incidence may be reflected by the surface of incidence of the light conversion member 20, and thus may be a factor reducing conversion efficiency of the light conversion member 20.

According to the embodiment of the present application, the lighting device which minimizes the optical loss due to the reflected light and increases the conversion efficiency of the light conversion member may be provided by increasing the light which is perpendicularly incident on the surface of incidence of the light conversion member. To this end, a concavo-convex portion is formed on the surface of incidence of the light conversion member. The concavo-convex portion formed on the surface of incidence may be, for example, diffraction gratings, a recessed portion of an aspherical surface, or the like.

Figure 3:
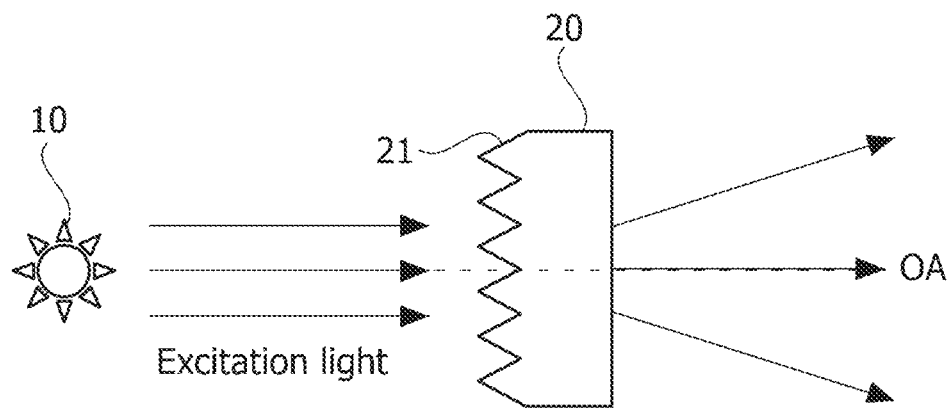
FIGS. 3 and 4 are views illustrating a light conversion member according to one embodiment of the present application.
Figure 4:
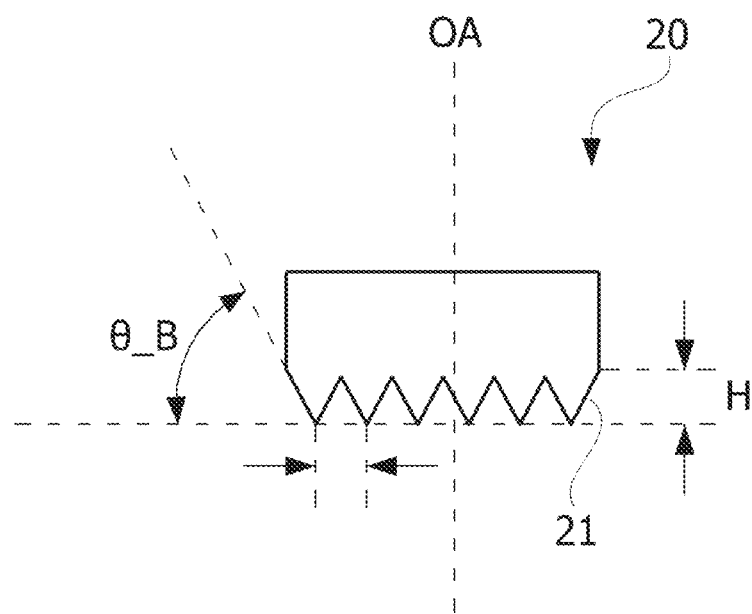
Figure 5:
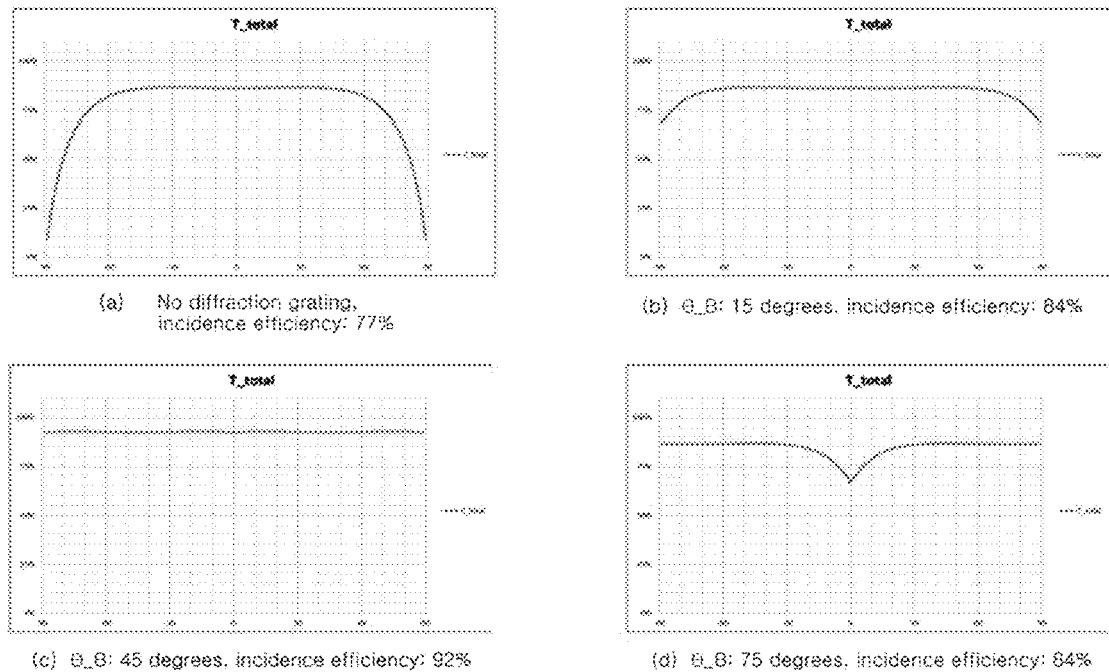
FIG. 5 is a view illustrating an effect of the light conversion member according to one embodiment of the present application.

FIGS. 3 and 4 are views illustrating the light conversion member according to one embodiment of the present application. Further, FIG. 5 is a view illustrating an effect of the light conversion member according to one embodiment of the present application.

Referring to FIG. 3, one or more diffraction gratings 21 may be provided on the surface of incidence of the light conversion member 20 on which the excitation light is incident from the light source 10. Each diffraction grating 21 may have various cross-sectional shapes perpendicular to the OA, such as a triangular shape, a quadrangular shape, a circular shape and an elliptical shape. Further, each diffraction grating 21 may have various cross-sectional shapes parallel to the OA, such as a triangular shape, a semicircular shape and an elliptical shape.

The diffraction gratings 21 may be periodically formed on the surface of incidence of the light conversion member 20 to form a periodic pattern, or may be aperiodically formed thereon to form an aperiodic pattern. When the diffraction gratings 21 form the periodic pattern, a distance between the diffraction gratings 21, i.e., a period of the diffraction gratings 21, may be designed differently according to a diameter of pump light output from the light source 10.

Assuming that the diameter of the pump light output from the light source 10 is A, the distance B between the diffraction gratings 21 may be expressed by the following Equation 1.

$$B < \frac{A}{2} \qquad \text{[Equation 1]}$$

Referring to Equation 1, to enhance the light incidence efficiency of the light conversion member 20, at least two or more diffraction gratings should be included at a region of incidence of the pump light.

As illustrated in FIG. 4, when the cross-sectional shape of the diffraction gratings 21 which are parallel to the OA is a triangular shape, and the diffraction gratings 21 are periodically arranged to form a periodic pattern, a height H of the diffraction gratings 21 may be defined by the following Equation 2.

$$H = \frac{B}{(2 \times \tan(\theta_B))} \qquad \text{[Equation 2]}$$

According to Equation 2, the height H of the diffraction gratings 21 is determined by a period B of the diffraction gratings 21 and an angle $\theta_B$ of the diffraction gratings 21. As illustrated in FIG. 4, the angle $\theta_B$ of the diffraction gratings 21 may be defined as a slope of a certain line segment of the diffraction gratings 21 with respect to a straight line perpendicular to the OA.

When the cross-sectional shape of the diffraction gratings 21 parallel to the OA is a circular shape, and the diffraction gratings 21 are periodically arranged to form a periodic pattern, a radius R of the diffraction gratings 21 may be defined by the following Equation 3.

$$R = \frac{B}{2} \qquad \text{[Equation 3]}$$

wherein B is the period of the diffraction gratings 21.

Further, when the cross-sectional shape of the diffraction gratings 21 parallel to the OA is an elliptical shape, and the diffraction gratings 21 are periodically arranged to form a periodic pattern, a major axis $R_L$ and a minor axis $R_S$ of the diffraction gratings 21 may be defined by the following Equation 4.

$$R_L < 4B \qquad \text{[Equation 4]}$$
$$R_S < \frac{B}{8}$$

wherein B is the period of the diffraction gratings 21.

Referring to FIG. 3, a plurality of diffraction gratings 21 may be formed in various manners. For example, the diffraction gratings 21 may be formed on the surface of incidence of the light conversion member 20 in a shape controlling manner such as a holographic manner. Further, for example, the diffraction gratings 21 may be formed on the surface of incidence of the light conversion member 20 in a refractive index modulating manner.

FIG. 5 is a view illustrating the effect of the light conversion member of FIG. 3, wherein (a) is a graph illustrating average light incidence efficiency of the light conversion member before the diffraction gratings are applied, and each of (b), (c) and (d) is a graph illustrating average light incidence efficiency of the light conversion member according to the slope of the diffraction gratings.

Referring to FIG. 5(a), in the case of the light conversion member which does not include the diffraction grating pattern, a section in which the light incidence efficiency is sharply reduced is included, and the average light incidence efficiency is about 77%.

However, as illustrated in FIGS. 5(b), 5(c) and 5(d), in the case of the light conversion member including the diffraction gratings, it may be understood that a deviation of the light incidence efficiency is not large, and the light incidence efficiency is generally enhanced. In particular, when the slope of the diffraction gratings is 45°, it may be understood that the average light incidence efficiency is about 92%, and the light incidence efficiency is increased by 15%.

When all of the diffraction gratings and the AR layer are applied to the surface of incidence of the light conversion member, the average light incidence efficiency of the light conversion member may be increased to 98%.

Figure 6:
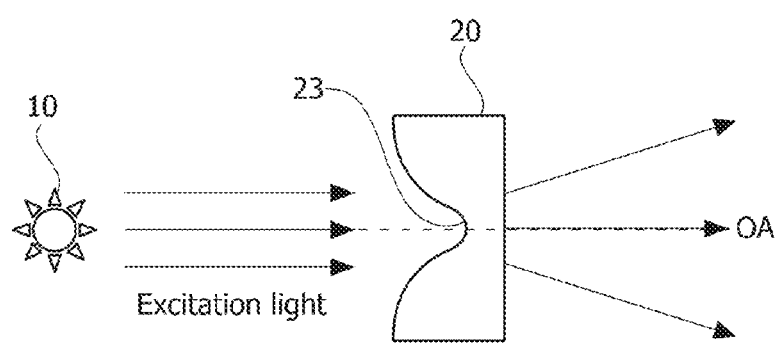
FIG. 6 is a view illustrating a light conversion member according to another embodiment of the present application.
Figure 7:
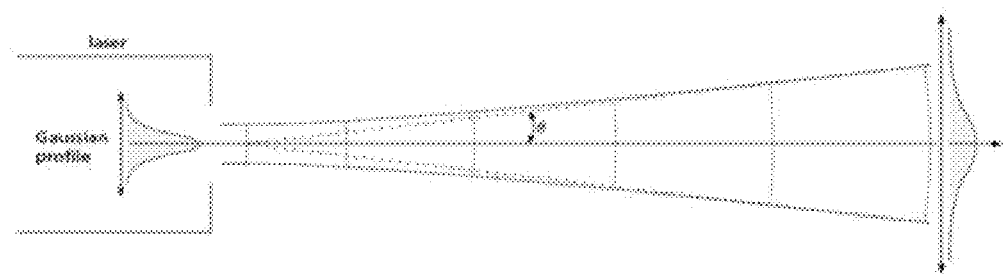
FIG. 7 is a view illustrating a wave front change of a laser beam according to a distance.
Figure 8:
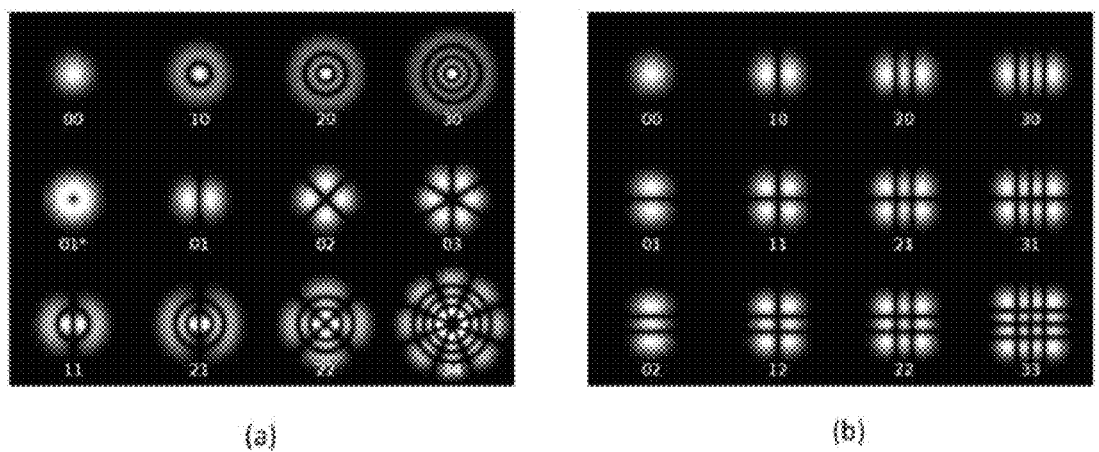
FIG. 8 is a view illustrating an example of a beam distribution according to a transverse mode of the laser beam.
Figure 9:
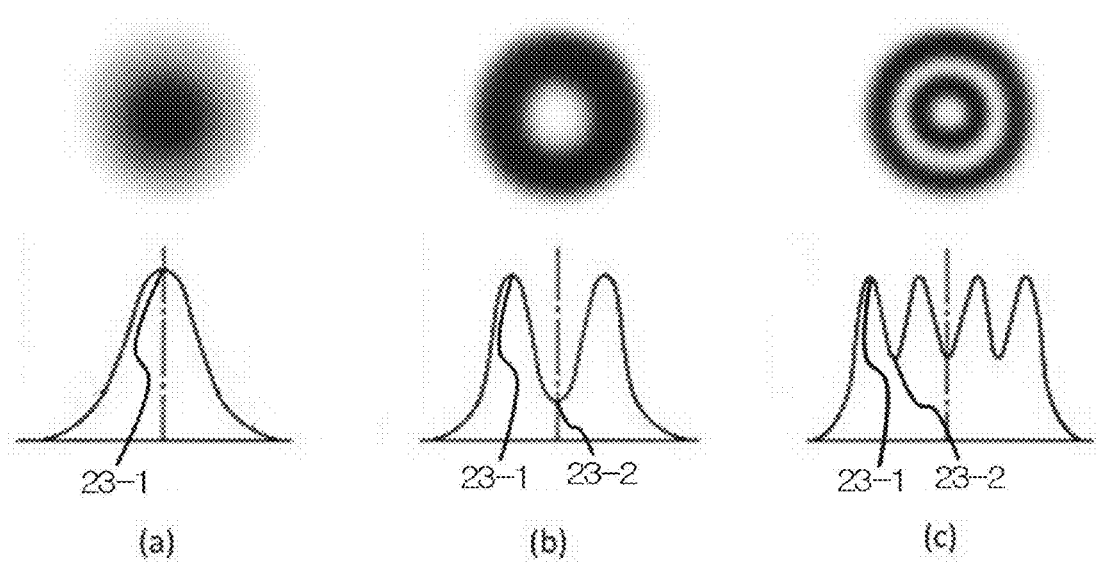
FIG. 9 is a view illustrating examples of a curved surface formed on a surface of incidence of the light conversion member according to another embodiment of the present application.

FIG. 6 is a view illustrating a light conversion member according to another embodiment of the present application. Also, FIG. 7 is a view illustrating a wave front change of a laser beam according to a distance. Also, FIG. 8 is a view illustrating an example of a beam distribution according to a transverse mode of the laser beam, and FIG. 9 is a view illustrating examples of a curved surface formed on the surface of incidence of the light conversion member according to another embodiment of the present application.

Referring to FIG. 6, the light conversion member 20 may include a recessed portion 23 formed in the surface of incidence on which the excitation light is incident from the light source 10. The recessed portion 23 is formed to be recessed toward an inner side of the light conversion member 20.

The recessed portion 23 may include an aspherical surface, and a shape of the aspherical surface may be formed to correspond to a wave front shape of the laser beam radiated from the light source 10. The recessed portion 23 may include at least one concave portion corresponding to the wave front shape of the laser beam. Also, the recessed portion 23 may further include at least one convex portion corresponding to the wave front shape of the laser beam.

As illustrated in FIG. 7, in the laser beam, a radius of curvature of the wave front is changed according to a distance between the light source 10 and the light conversion member 20. Therefore, a radius of curvature of an aspherical surface forming the recessed portion 23 may be changed according to the distance between the light source 10 and the light conversion member 20.

As illustrated in FIG. 8, the laser beam may have different intensity distribution according to a corresponding Gaussian mode. FIG. 8(a) illustrates a laser beam including circular polarized light in a Laguerre-Gaussian mode, FIG. 8(b) illustrates a laser beam including linear polarized light in a Hermite-Gaussian mode. Referring to FIG. 8, in each Gaussian mode, the laser beam may have different intensity distribution according to a transverse mode ($TEM_{xy}$).

The intensity distribution of the laser beam is a factor that determines a wave front shape of the laser beam incident on the light conversion member 20. Therefore, a shape of the aspherical surface forming the recessed portion 23 may be formed differently according to the transverse mode and the Gaussian mode of the laser beam radiated from the light source 10.

The shape of the aspherical surface forming the recessed portion 23 may be defined by the following Equation 5.

$$R(\alpha_{TEM}) = \frac{R(z)}{\alpha_{TEM}} \quad \text{[Equation 5]}$$

Equation 5 is a radius of curvature function which determines the shape of the aspherical surface, and R(z) is a radius of curvature function for calculating the radius of curvature according to a distance of a Gaussian beam. Further, $\alpha_{TEM}$ is a constant which determines the radius of curvature of the recessed portion 23, and a number and a size of the concave portions and the convex portions included in the recessed portion 23 may be changed according to $\alpha_{TEM}$. $\alpha_{TEM}$ may have a different value according to the Gaussian mode and the transverse mode. For example, $\alpha_{TEM}$ may have a value of 0.1 to 10.

A laser beam generated in $TEM_{00}$ which is a minimum order transverse mode of a laser resonator is a Gaussian beam in which width distribution of waves on the cross-sectional shape perpendicular to the OA is indicated by a bell-shaped Gaussian function. Therefore, R(z) corresponds to the radius of curvature according to the distance of the laser beam generated in $TEM_{00}$, and may be defined by the following Equation 6.

$$R(z) = z\left[1 + \left(\frac{\pi\omega_0^2}{\lambda z}\right)^2\right] \quad \text{[Equation 6]}$$

wherein z is the distance between the light source 10 and the light conversion member 20, λ is a wavelength of the laser beam radiated from the light source 10, and $\omega_0$ is a spot size in a beam waist of the laser beam, and corresponds to a radius of the beam. In order to maximize the light incidence efficiency, $\omega_0$ may be defined as in the following Equation 7.

$$\omega_0 = \left(\frac{\lambda z}{\pi}\right)^{\frac{1}{2}} \quad \text{[Equation 7]}$$

Meanwhile, like $TEM_{01*}$ in the Laguerre-Gaussian mode illustrated in FIG. 8(a), when the intensity distribution is rotationally symmetric about the OA, the wave front of the laser beam may also be rotationally symmetric about the OA. Further, the aspherical surface of the recessed portion 23 corresponding to this may be rotationally symmetric about the OA.

When the aspherical surface of the recessed portion 23 is formed to be rotationally symmetric about the OA, all radii of curvature of an X axis and a Y axis of the aspherical surface may be calculated using Equation 5.

However, like $TEM_{00}$ in the Laguerre-Gaussian mode illustrated in FIG. 8(a), when the intensity distribution is rotationally asymmetric about the OA, the wave front of the laser beam may have a freeform shape which is rotationally asymmetric about the OA. Further, the aspherical surface of the recessed portion 23 corresponding to this may have a freeform shape which is rotationally asymmetric about the OA.

When the aspherical surface of the recessed portion 23 is formed to be rotationally asymmetric about the OA, the X axis and the Y axis of the aspherical surface may have different radii of curvature from each other, and the radius of curvature in the X axis and the radius of curvature in the Y axis may be calculated using the following Equation 8.

$$R(\alpha_{TEM_X}) = \frac{R(z)}{\alpha_{TEM_X}} \quad \text{[Equation 8]}$$

$$R(\alpha_{TEM_Y}) = \frac{R(z)}{\alpha_{TEM_Y}}$$

wherein R(z) is a function for calculating the radius of curvature according to the distance of the Gaussian beam, $\alpha_{TEM_x}$ and $\alpha_{TEM_y}$ are constants which determine the radii of curvature in the X axis and the Y axis, respectively, and the number and the size of the concave portions and the convex portions included in the recessed portion 23 may be changed according to $\alpha_{TEM_x}$ and $\alpha_{TEM_y}$. $\alpha_{TEM_x}$ and $\alpha_{TEM_y}$ may have different values from each other according to the transverse mode and the Gaussian mode of the laser beam. For example, each of $\alpha_{TEM_x}$ and $\alpha_{TEM_y}$ may have a value of 0.1 to 10.

Regardless of whether the aspherical surface of the recessed portion 23 is rotationally symmetric or asymmetric about the OA, the cross-sectional shape on the X axis or the Y axis of the aspherical surface of the recessed portion 23 may be rotationally symmetric about the OA.

FIG. 9 illustrates the cross-sectional shape of the recessed portion 23 designed by applying Equations 5 to 7, for example, when the laser beam of the Laguerre-Gaussian mode is incident. Further, FIGS. 9(a), 9(b) and 9(c) illustrate the cases in which the laser beams in the transverse mode of $TEM_{00}$, $TEM_{01*}$, and $TEM_{10}$ are incident.

Referring to FIG. 9, the recessed portion 23 is formed so that the cross-sectional shape thereof is symmetric about the OA, and may include the aspherical surface having a different shape according to the transverse mode of the laser beam. The recessed portion 23 includes at least one concave portion (23-1) or convex portion (23-2), and the number and the size (width) of the concave portions and the convex portions may be changed according to the transverse mode of the laser beam. Also, a position of the concave portion and the convex portion formed at the recessed portion 23 is changed according to the transverse mode of the laser beam.

For example, the recessed portion 23 may include only one concave portion formed at a center thereof to have a bell-shaped Gaussian form in $TEM_{00}$, as illustrated in FIG. 9(a), and may further include one convex portion formed to have a donut shape in $TEM_{01*}$ together with the concave portion, as illustrated in FIG. 9(b). Further, as illustrated in FIG. 9(c), the number of the concave portions and the convex portions may be increased. That is, the recessed portion 23 may include a plurality of concave portions and convex portions in a multi-transverse mode of $TEM_{01}$.

As described above, in another embodiment of the present application, since the recessed portion corresponding to the wave front shape of the laser is formed on the surface of incidence of the light conversion member 20, a ratio of the light which is perpendicularly incident on the surface of incidence of the light conversion member 20 may be increased, and thus the light incidence efficiency may be increased. When the recessed portion corresponding to the wave front shape of the laser is formed on the surface of incidence of the light conversion member 20, the light incidence efficiency of the light conversion member is increased to about 95% or more. When the AR layer is coated on the surface of incidence of the light conversion member 20 including the recessed portion, the light incidence efficiency is increased to about 99% or more.

According to embodiment of the present application, since the recessed portion corresponding to the diffraction gratings or the wave front shape of the excitation light is formed in the surface of incidence of the light conversion member, the incidence efficiency and the optical loss at the surface of incidence are minimized, and thus the conversion efficiency of the light conversion member is enhanced.

The present application is directed to a light conversion member which improves incidence efficiency of excitation light incident on the light conversion member and thus enhances conversion efficiency of the excitation light, and a lighting device including the same.

According to an aspect of the present application, there is provided a light conversion member including a surface of incidence which includes a recessed portion and on which a laser beam is incident; and an output surface in which a wavelength of the laser beam is converted and the laser beam having the converted wavelength is output, wherein a shape of the recessed portion is formed to correspond to a wave front shape of the laser beam.

According to another aspect of the present application, there is provided a light conversion member including a surface of incidence which includes a plurality of diffraction gratings and on which a laser beam is incident; and an output surface in which a wavelength of the laser beam is converted and the laser beam having the converted wavelength is output, wherein a distance between the diffraction gratings is formed to correspond to a diameter of the laser beam.

Terms including ordinal numbers such as "first," "second," etc. can be used to describe various components, but the components are not limited by those terms. The terms are used merely for the purpose of distinguishing one component from another. For example, a first component may be called a second component, and similarly, a second component may be called a first component without departing from the scope of rights of the invention. The term "and/or" encompasses combinations of a plurality of items or any one of the plurality of items.

It is to be noted that, in this specification, when a certain component is said to be connected to another component, the certain component may be directly connected to the other component, or a third component may be interposed therebetween. On the other hand, when a certain component is said to be directly connected to another component, no third component is interposed therebetween.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light conversion member comprising:
a surface of incidence which includes a recessed portion on which a laser beam is incident; and
an output surface in which a wavelength of the laser beam is converted and the laser beam having the converted wavelength is output,
wherein the recessed portion has a shape corresponding to a Gaussian mode of the laser beam.

2. The light conversion member of claim 1, wherein the shape of the recessed portion is formed differently according to a distance between a light source configured to radiate the laser beam and the light conversion member.

3. The light conversion member of claim 1, wherein the shape of the recessed portion has a determined by function for calculating a radius of curvature according to a distance of Gaussian beam.

4. The light conversion member of claim 1, wherein the shape of the recessed portion satisfies a radius of curvature function ($R(\alpha_{TEM})$) of Equation 1 as follows:

$$R(\alpha_{TEM}) = \frac{R(z)}{\alpha_{TEM}} \quad \text{[Equation 1]}$$

wherein $\alpha_{TEM}$ is a constant which determines the radius of curvature of recessed portion, and R(z) is a radius of curvature function of a Gaussian beam of the following Equation 2, $$R(z) = z\left[1 + \left(\frac{\pi\omega_0^2}{\lambda z}\right)^2\right] \quad \text{[Equation 2]}$$

wherein z is the distance between the light source configured to radiate the laser beam and the light conversion member, $\lambda$ is a wavelength of the laser beam, and $\omega_0$ is a spot size in a beam waist of the laser beam.

5. The light conversion member of claim 1, wherein the recessed portion includes at least one concave portion or convex portion.

6. The light conversion member of claim 5, wherein a number of the at least one concave portion or convex portion formed at the recessed portion is varied according to a transverse mode of the laser beam.

7. The light conversion member of claim 1, wherein the light conversion member includes at least one of a phosphor, a remote phosphor and a quantum dot.

8. The light conversion member of claim 1, wherein an anti-reflection layer is formed on the surface of incidence.

9. A lighting device comprising:
a light source configured to radiate a laser beam;
a light conversion member in which a wavelength of the laser beam incident from the light source is converted and the laser beam having the converted wavelength is output; and
a reflection member configured to reflect light output from the light conversion member and to output the light as an output,
wherein a recessed portion is formed on a surface of incidence of the light conversion member,
wherein a shape of the recessed portion is formed to correspond to a Gaussian mode of the laser beam.

10. The lighting device of claim 9, wherein the shape of the recessed portion is formed differently according to a distance between the light source and the light conversion member.

11. The light device of claim 9, wherein the shape of the recessed portion is determined by a function for calculating a radius of curvature according to a distance of a Gaussian beam.

* * * * *